United States Patent
Shin et al.

(10) Patent No.: US 8,199,552 B2
(45) Date of Patent: Jun. 12, 2012

(54) UNIT CELL OF NONVOLATILE MEMORY DEVICE AND NONVOLATILE MEMORY DEVICE HAVING THE SAME

(75) Inventors: Chang-Hee Shin, Cheongju-si (KR); Ki-Seok Cho, Cheongju-si (KR); Seong-Do Jeon, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 94 days.

(21) Appl. No.: 12/320,974

(22) Filed: Feb. 10, 2009

(65) Prior Publication Data

US 2009/0201713 A1  Aug. 13, 2009

(51) Int. Cl.
*G11C 17/00* (2006.01)

(52) U.S. Cl. .......... 365/96; 365/207; 365/104; 365/102; 365/103; 365/105; 365/149; 365/186; 365/189.15; 365/189.16; 365/233.16; 365/233.17

(58) Field of Classification Search .................... 365/96, 365/207, 104, 102, 103, 105, 149, 186, 189.15, 365/189.16, 233.16, 233.17
See application file for complete search history.

(56) References Cited

U.S. PATENT DOCUMENTS

| | | | |
|---|---|---|---|
| 6,044,012 A * | 3/2000 | Rao et al. | 365/182 |
| 6,434,077 B1 | 8/2002 | Holmes | |
| 6,927,997 B2 | 8/2005 | Lee et al. | |
| 6,985,387 B2 * | 1/2006 | Chen et al. | 365/189.15 |
| 7,321,502 B2 * | 1/2008 | Paillet et al. | 365/102 |
| 2006/0092742 A1 * | 5/2006 | Paillet et al. | 365/225.7 |
| 2007/0070679 A1 * | 3/2007 | Cowles | 365/96 |
| 2007/0253236 A1 * | 11/2007 | Nakazawa | 365/96 |
| 2008/0159042 A1 * | 7/2008 | Bertin et al. | 365/225.7 |
| 2008/0165586 A1 * | 7/2008 | Matsufuji et al. | 365/185.23 |

* cited by examiner

*Primary Examiner* — Fernando Hidalgo
(74) *Attorney, Agent, or Firm* — NSIP Law

(57) ABSTRACT

A One-Time Programmable (OTP) unit cell and a nonvolatile memory device having the same are disclosed. A unit cell of a nonvolatile memory device includes: an anti-fuse connected between an output terminal and a ground voltage terminal; a first switching unit connected to the output terminal to transfer a write voltage to the output terminal; and a second switching unit connected to the output terminal to transfer a read voltage to the output terminal.

30 Claims, 10 Drawing Sheets

UNIT CELL OF NONVOLATILE MEMORY DEVICE AND NONVOLATILE MEMORY DEVICE HAVING THE SAME

CROSS-REFERENCE TO RELATED APPLICATIONS

This application claims the benefit under 35 U.S.C. §119(a) of Korean Patent Application No. 10-2008-0013045, filed on Feb. 13, 2008, in the Korean Intellectual Property Office, the entire disclosure of which is incorporated herein by reference for all purposes.

BACKGROUND OF THE INVENTION

1. Field of the Invention

The following description relates to semiconductor design technology; and, more particularly, to a One-Time Programmable (OTP) unit cell and a nonvolatile memory device having the same.

2. Description of Related Art

Since One-Time Programmable (OTP) memory devices have nonvolatile characteristics of retaining data, which are stored in memory cells, even in a power-off state, they are becoming widely used as memory devices that can replace memory sticks, Universal Serial Bus (USB) drivers, and hard disks.

Figure 1:
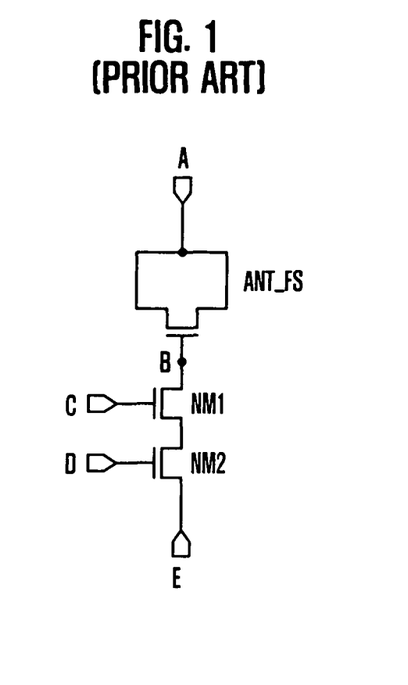
FIG. 1 is an equivalent circuit diagram of a conventional OTP unit cell.

FIG. 1 is an equivalent circuit diagram of a conventional OTP unit cell.

Referring to FIG. 1, a conventional OTP unit cell includes an anti-fuse ANT_FS connected between a first input terminal A and a node B, and n-channel transistors NM1 and NM2 connected in series between a node B and an output terminal E (i.e., a terminal through which data are outputted in a read operation).

Hereinafter, a description will be given of a write/read operation of the conventional OTP unit cell.

TABLE 1

|  | Terminal (Node) | | |
| --- | --- | --- | --- |
| Mode | A | C | D |
| Write Operation | VPP | L | L |
| Read Operation | VDD | H | H |

Write Operation

First, the node B is grounded. Then, a high voltage VPP is applied to the first input terminal A and a logic low level L corresponding to a ground voltage is applied to second and third input terminals C and D. Accordingly, a high electric field is formed between a substrate and a gate of the anti-fuse ANT_FS including a MOS transistor, to break a gate insulating layer formed between the substrate and the gate. Thus, the substrate and the gate of the anti-fuse ANT_FS are electrically shorted.

Read Operation

After completion of the write operation, a power supply voltage VDD is applied to the first input terminal A and a logic high level H corresponding to the power supply voltage VDD is applied to the second and third input terminals C and D. Accordingly, a current path is formed from the first input terminal A, through the anti-fuse ANT_FS and the first and second transistors NM1 and NM2, to the output terminal E. Thus, the power supply voltage VDD applied to the first input terminal A is transferred to the output terminal E so that the power supply voltage VDD is detected.

However, the conventional OTP unit cell illustrated in FIG. 1 has the following limitations.

As described above, the current path (i.e., data path) formed from the first input terminal A to the output terminal E in the read operation must include the first and second transistors NM1 and NM2 that are connected in series. Accordingly, the final data detected through the output terminal E are outputted in a state of being voltage-dropped by the sum of threshold voltages of the first and second transistors NM1 and NM2 (i.e., VDD—2Vt where 'Vt' denotes the threshold voltage of each of the first and second transistors NM1 and NM2). Thus, a sensing margin of the data sensed through the output terminal E degrades by the voltage drop, thus leading to a malfunction. The malfunction causes degradation in the read operation reliability of the OTP unit cell.

SUMMARY OF THE INVENTION

An example embodiment is directed to a unit cell of a nonvolatile memory device and a nonvolatile memory device having the same, which may improve a data sensing margin in a read operation, thereby making it possible to improve the operational reliability.

In one general aspect, there is provided a unit cell of a nonvolatile memory device, which includes: an anti-fuse connected between an output terminal and a ground voltage terminal; a first switching unit connected to the output terminal to transfer a write voltage to the output terminal; and a second switching unit connected to the output terminal to transfer a read voltage to the output terminal.

In another general aspect, there is provided a unit cell of a nonvolatile memory device, which includes: an anti-fuse connected between a node and a ground voltage terminal; a first switching unit connected to the node to transfer a write voltage to the node; a second switching unit connected between the node and an output terminal; and a third switching unit connected to the output terminal to transfer a read voltage to the output terminal.

In another general aspect, there is provided a nonvolatile memory device including: a cell array including a plurality of unit cells arranged in a matrix type; a plurality of data lines connected in common to an output terminal of the unit cells; and a plurality of sensor units including inverters configured to respectively invert voltages of the data lines.

In another general aspect, there is provided a nonvolatile memory device including: a cell array including a plurality of the unit cells arranged in a matrix type; a plurality of write driving lines configured to select and control the first switching unit of the unit cell; a plurality of first read driving lines configured to select and control the second switching unit of the unit cell; a plurality of data lines connected to an output terminal of the unit cell; a plurality of third switching units configured to transfer the read voltage to the data line; a second read driving line configured to select and control the third switching units in common; and a plurality of sensor units configured to sense a voltage of the data line.

In another general aspect, there is provided a nonvolatile memory device including: a cell array including a plurality of the unit cells arranged in a matrix type; a plurality of write driving lines configured to select and control the first switching unit of the unit cell; a plurality of first read driving lines configured to select and control the second switching unit of the unit cell; a plurality of data lines connected to an output terminal of the unit cell; a second read driving line configured to select and control the third switching units of the unit cells in common; and a plurality of sensor units configured to sense a voltage of the data line.

Other features and aspects may be understood by the following description, the drawings, and the claims.

DETAILED DESCRIPTION

Features and aspects may become apparent from the following description of the example embodiments with reference to the accompanying drawings, which is set forth hereinafter. It is understood that the features of the present disclosure may be embodied in many different forms and should not be construed as being limited to the example embodiments set forth herein; rather, these embodiments are provided so that this disclosure will be thorough and complete, and will fully convey the full scope of the present disclosure to those skilled in the art. Like reference numerals in the drawings denote like elements, and thus their description will be omitted for conciseness. A term 'transistor' used herein includes any unit that operates as a switching unit according to a control signal input to a gate. Examples of the transistor include a junction field-effect transistor (JFET) and a metal-oxide-semiconductor field-effect transistor (MOSFET).

Embodiment 1

Figure 2:
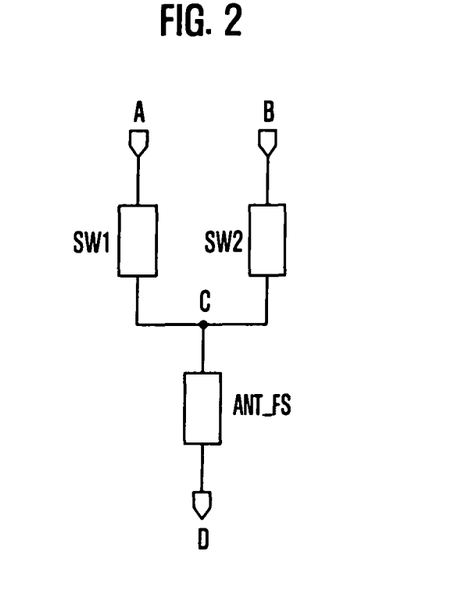
FIG. 2 is an equivalent circuit diagram illustrating an example of a unit cell of a nonvolatile memory device in accordance with an embodiment 1.
Figure 3A:
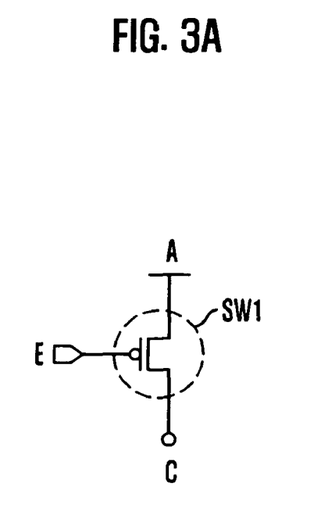
FIGS. 3A and 3B are circuit diagrams of a first switching unit SW1 illustrated in FIG. 2.
Figure 3B:
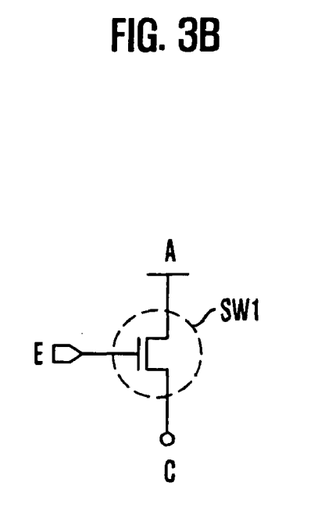
Figure 4A:
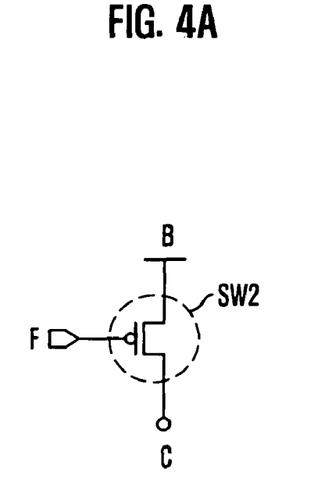
FIGS. 4A and 4B are circuit diagrams of a second switching unit SW2 illustrated in FIG. 2.
Figure 4B:
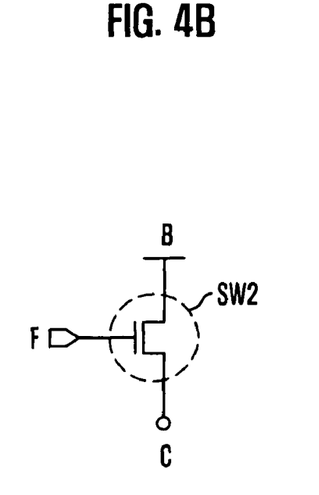
Figure 5A:
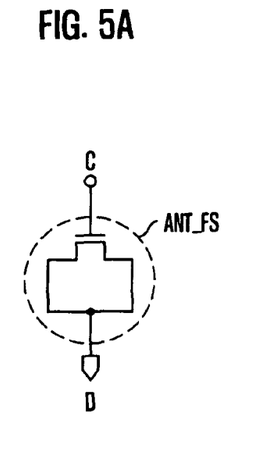
FIGS. 5A and 5B are circuit diagrams of an anti-fuse ANT_FS illustrated in FIG. 2.
Figure 5B:
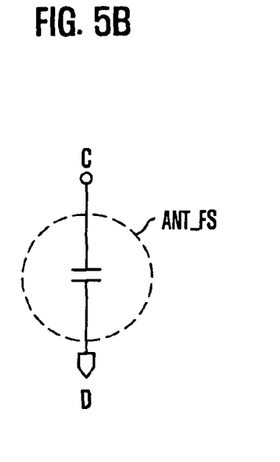
Figure 6A:
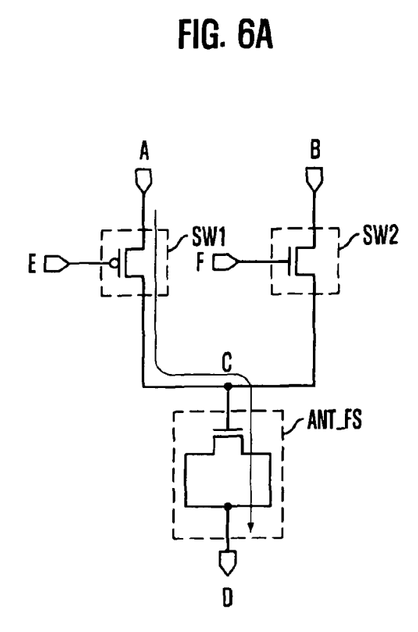
FIGS. 6A and 6B are circuit diagrams illustrating examples of the operational characteristics of the unit cell of the nonvolatile memory device in accordance with the embodiment 1.
Figure 6B:
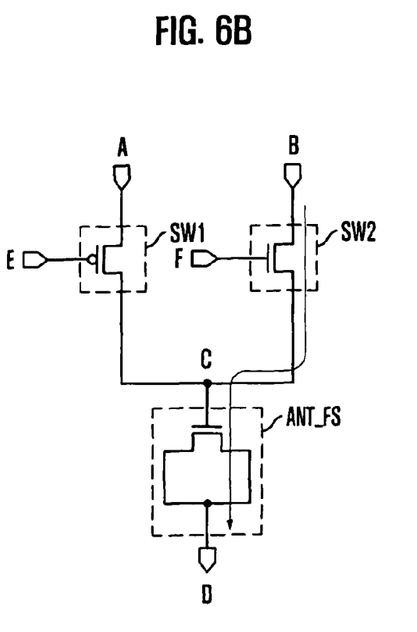

FIG. 2 is an equivalent circuit diagram illustrating an example of a unit cell of a nonvolatile memory device in accordance with an embodiment 1. FIGS. 3A and 3B are circuit diagrams of a first switching unit SW1 illustrated in FIG. 2. FIGS. 4A and 4B are circuit diagrams of a second switching unit SW2 illustrated in FIG. 2. FIGS. 5A and 5B are circuit diagrams of an anti-fuse ANT_FS illustrated in FIG. 2. FIGS. 6A and 6B are circuit diagrams illustrating examples of the operational characteristics of the unit cell of the nonvolatile memory device in accordance with the embodiment 1.

Referring to FIG. 2, an example of a unit cell of a nonvolatile memory device in accordance with an embodiment 1 includes an anti-fuse ANT_FS connected between a ground voltage terminal D and an output terminal C (i.e., a terminal through which data are outputted in a read operation), a first switching unit SW1 connected between a first input terminal A and the output terminal C, and a second switching unit SW2 connected between a second input terminal B and the output terminal C.

As illustrated FIGS. 3A and 3B, the first switching unit SW1 may include a transistor (i.e., an active device) to transfer a write voltage, inputted to the first input terminal A, to the output terminal C. Herein, the transistor may be a low-voltage transistor or a high-voltage transistor. Also, the transistor may be a p-channel transistor or an n-channel transistor. For example, the first switching unit SW1 may include a p-channel transistor that is superior in driving capability to an n-channel transistor. In this case, the transistor has a drain connected to the first input terminal A, a source connected to the output terminal C, and a gate connected to a third input terminal E.

As illustrated FIGS. 4A and 4B, the second switching unit SW2 is connected in parallel to the first switching unit SW1 in terms of the output terminal C. Also, the second switching unit SW2 may include a transistor (i.e., an active device) to transfer a read voltage, inputted to the second input terminal B, to the output terminal C. Herein, the channel type of the transistor may be identical to or different from the channel type of the transistor of the first switching unit SW1. Also, the transistor has a drain connected to the second input terminal B, a source connected to the output terminal C, and a gate connected to a fourth input terminal F.

As illustrated in FIGS. 5A and 5B, the anti-fuse ANT_FS may include a transistor (i.e., an active device) or a capacitor (i.e., a passive device). Herein, the transistor may be a p-channel transistor or an n-channel transistor. Also, a gate of the transistor is connected to the output terminal C, a drain and a source of the transistor are connected to each other and are connected in common to the ground voltage terminal D. The capacitor has a first terminal (i.e., an upper electrode) connected to the output terminal C, and a second terminal (i.e., a lower electrode) connected to the ground voltage terminal D.

Hereinafter, a description will be given of an example of an operation of the unit cell of the nonvolatile memory device in accordance with the embodiment 1. Herein, for example, the first switching unit SW1 includes a p-channel transistor and the second switching unit SW2 includes an n-channel transistor. The anti-fuse ANT_FS includes an n-channel transistor.

TABLE 2

| Mode | Terminal | | | | | |
|---|---|---|---|---|---|---|
| | A | B | C | D | E | F |
| Write Operation | VPP | — | — | VSS | L | L |
| Read Operation | — | VDD | — | VSS | H | H |

A description will be made with reference to Table 2 and FIGS. 6A and 6B. Herein, FIG. 6A is an equivalent circuit diagram illustrating a current path in a write operation, and FIG. 6B is an equivalent circuit diagram illustrating a current path in a read operation.

Write Operation

First, the ground voltage terminal D is grounded. Then, a high voltage VPP is applied to the first input terminal A and a logic low level L corresponding to a ground voltage is applied to the third and fourth input terminals E and F. Under this condition, only the first switching unit SW1 including a p-channel transistor is turned on. Thus, the first input terminal A and the output terminal C are electrically connected to each other, and the second input terminal B and the output terminal C are electrically disconnected from each other. Accordingly, the high voltage VPP is transferred through the first switching unit SW1 to the anti-fuse ANT_FS to break a gate insulating layer formed between a substrate and a gate of the anti-fuse ANT_FS.

Read Operation

After completion of the write operation, a power supply voltage VDD corresponding to a read voltage is applied to the second input terminal B and a logic high level H corresponding to the power supply voltage VDD is applied to the third and fourth input terminals E and F. Under this condition, only the second switching unit SW2 including an n-channel transistor is turned on.

Thus, the second input terminal B and the output terminal C are electrically connected to each other, and the first input terminal A and the output terminal C are electrically disconnected from each other. Accordingly, a current path is formed from the second input terminal B, through the second switching unit SW2, to the anti-fuse ANT_FS.

In this case, because the gate insulating layer of the anti-fuse ANT_FS is broken, the output terminal C is electrically connected to the ground voltage terminal D through the anti-fuse ANT_FS. Thus, data corresponding to the ground voltage are outputted to the output terminal C, which are sensed by a sensor unit.

Embodiment 2

Figure 7:
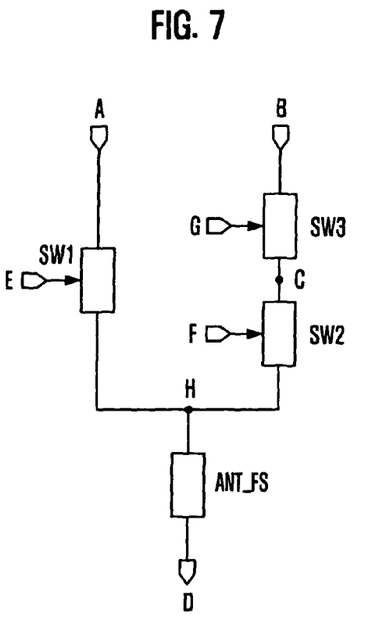
FIG. 7 is an equivalent circuit diagram illustrating an example of a unit cell of a nonvolatile memory device in accordance with an embodiment 2.
Figure 8A:
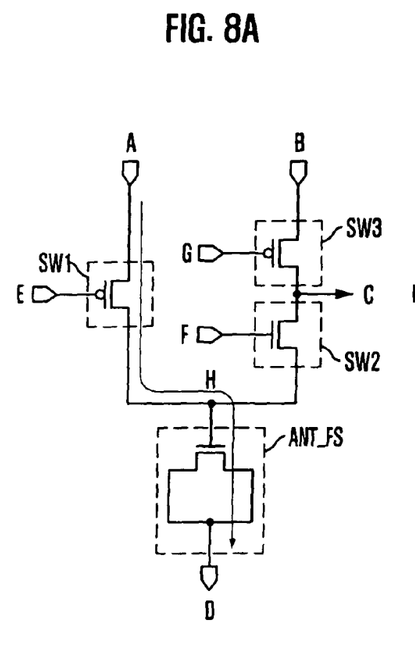
FIGS. 8A and 8B are circuit diagrams illustrating examples of the operational characteristics of the unit cell of the nonvolatile memory device in accordance with the embodiment 2.
Figure 8B:
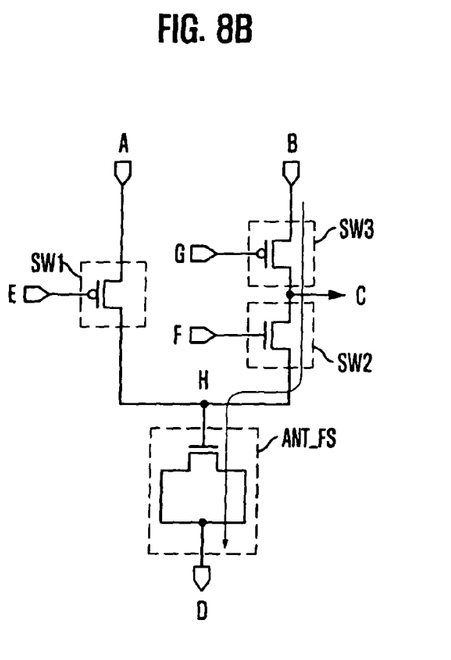

FIG. 7 is an equivalent circuit diagram illustrating an example of a unit cell of a nonvolatile memory device in accordance with an embodiment 2. FIGS. 8A and 8B are circuit diagrams illustrating examples of the operational characteristics of the unit cell of the nonvolatile memory device in accordance with the embodiment 2.

Referring to FIG. 7, an example of a unit cell of a nonvolatile memory device, in accordance with an embodiment 2 basically includes an anti-fuse ANT_FS, a first switching unit SW1, and a second switching unit SW2, like the example of the unit cell of the nonvolatile memory device in accordance with the embodiment 1.

Also, the example of the unit cell of the nonvolatile memory device in accordance with the embodiment 2 further includes a third switching unit SW3 connected in series to the second switching unit SW2. Accordingly, the first switching unit SW1 is connected in parallel to the second and third switching units SW2 and SW3 that are connected in series to each other.

The first switching unit SW1 may include a transistor (i.e., an active device) to transfer a write voltage, to an input terminal of the anti-fuse ANT_FS connected to a node H. Herein, the transistor may be a p-channel transistor or an n-channel transistor. In this case, the transistor has a drain connected to a first input terminal A, a source connected to the node H, and a gate connected to a third input terminal E.

The second switching unit SW2 is connected between an output terminal C and the node H. Like the first switching unit SW1, the second switching unit SW2 may include a transistor (i.e., an active device). Herein, the transistor may be a p-channel transistor or an n-channel transistor. In this case, the transistor has a drain connected to the output terminal C, a source connected to the node H, and a gate connected to a fourth input terminal F.

Like the second switching unit SW2, the third switching unit SW3 may include a transistor (i.e., an active device) to transfer a read voltage to the output terminal C. Herein, the transistor may be a p-channel transistor or an n-channel transistor. In this case, the transistor has a drain connected to a second input terminal B, a source connected to the output terminal C, and a gate connected to a fifth input terminal G.

Meanwhile, the first to third switching units SW1, SW2 and SW3 may have the same channel type or may have different channel types. Preferably, the first and third switching units SW1 and SW3 have a p-channel, and the second switching unit SW2 has an n-channel.

Hereinafter, a description will be given of an example of an operation of the unit cell of the nonvolatile memory device in accordance with the embodiment 2. Herein, for example, the first and third switching units SW1 and SW3 include a p-channel transistor and the second switching unit SW2 includes an n-channel transistor. The anti-fuse ANT_FS includes an n-channel transistor.

TABLE 3

| Mode | Terminal (Node) | | | | | | |
|---|---|---|---|---|---|---|---|
| | A | B | C | D | E | F | G |
| Write Operation | VPP | — | — | VSS | L | L | H |
| Read Operation | — | VDD | — | VSS | H | H | L |

A description will be made with reference to Table 3 and FIGS. 8A and 8B. Herein, FIG. 8A is an equivalent circuit diagram illustrating a current path in a write operation, and FIG. 8B is an equivalent circuit diagram illustrating a current path in a read operation.

Write Operation

First, a ground voltage terminal D is grounded. Then, a high voltage VPP is applied to the first input terminal A and a logic low level L is applied to the third and fourth input terminals E and F. Also, a logic high level H is applied to the fifth input terminal G. Under this condition, only the first switching is turned on.

Thus, the first input terminal A and the node H are electrically connected to each other, and the second input terminal B and the node H are electrically disconnected from each other. Accordingly, the high voltage VPP is transferred through the first, switching unit SW1 to the anti-fuse ANT_FS to break a gate insulating layer formed between a substrate and a gate of the anti-fuse ANT_FS. That is, the gate and the substrate are electrically shorted.

Read Operation

After completion of the write operation, a power supply voltage VDD corresponding to a read voltage is applied to the second input terminal B and a logic high level H is applied to the third and fourth input terminals E and F. Also, a logic low level L is applied to the fifth input terminal G. Under this condition, the second and third switching units SW2 and SW3 are turned on.

Thus, the second input terminal B and the node H are electrically connected to each other, and the first input terminal A and the node H are electrically disconnected from each other. Accordingly, a current path is formed from the second input terminal B, through the second and third switching units SW2 and SW3, to the anti-fuse ANT_FS. In this case, because the gate insulating layer of the anti-fuse ANT_FS is broken, the output terminal C is electrically connected to the ground voltage terminal D through the second switching unit SW2 and the anti-fuse ANT_FS. Thus, data corresponding to a ground voltage are outputted to the output terminal C, which are sensed by a sensor unit.

Embodiment 3

Figure 9:
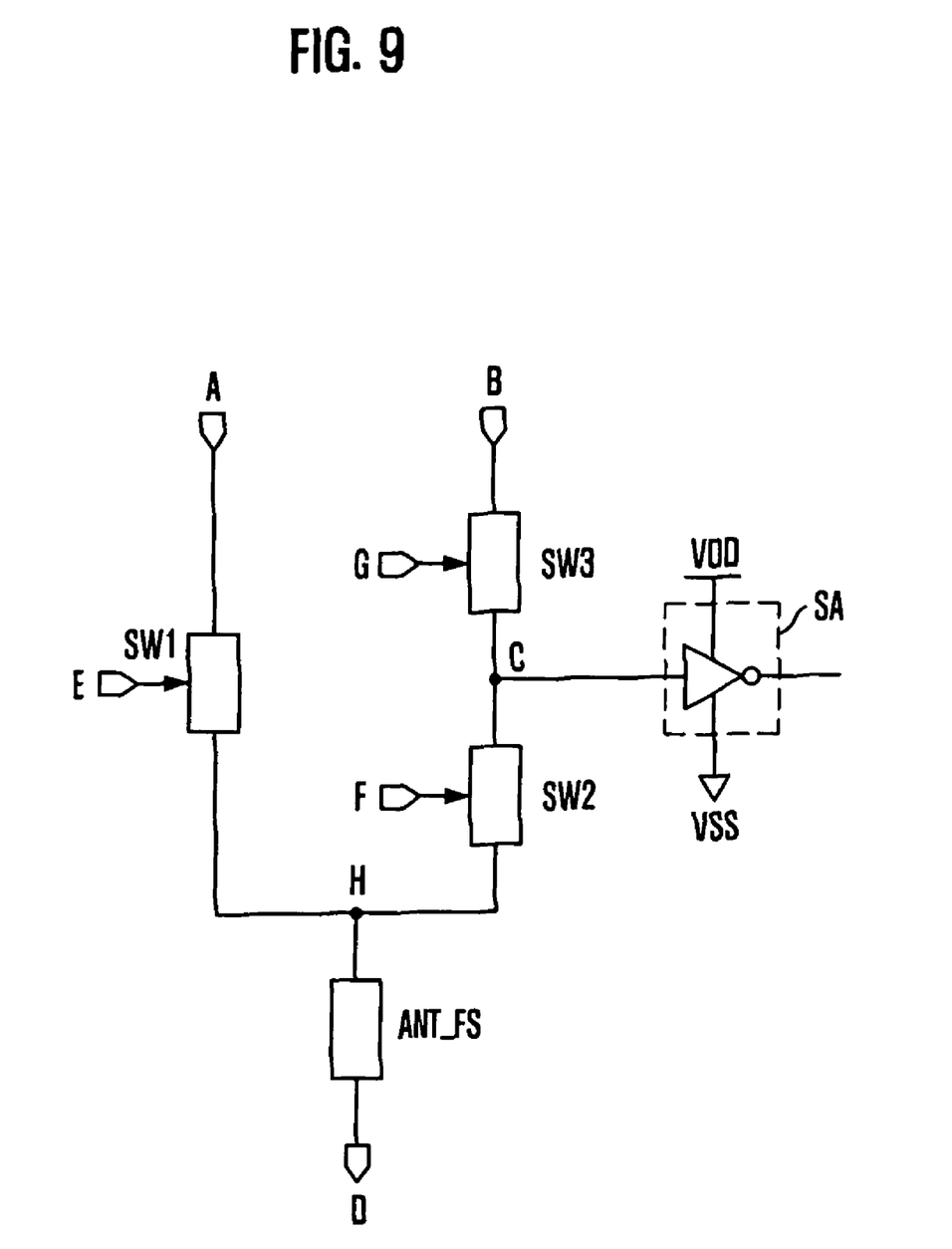
FIG. 9 is an equivalent circuit diagram illustrating an example of a unit cell of a nonvolatile memory device in accordance with an embodiment 3.

FIG. 9 is an equivalent circuit diagram illustrating an example of a unit cell of a nonvolatile memory device in accordance with an embodiment 3.

Referring to FIG. 9, except a sensor unit SA connected to an output terminal C, the configuration and operation of an example of a unit cell of a nonvolatile memory device in accordance with an embodiment 3 is identical to those of the embodiment 2, a description of which will be omitted for conciseness.

The sensor unit SA includes an inverter that inverts a voltage outputted through the output terminal C in a read operation. Herein, the inverter includes a CMOS transistor in which a p-channel transistor and an n-channel transistor are connected complementarily. For example, a source of the p-channel transistor and a drain of the n-channel transistor are connected to each other. Also, gates of the transistors are connected to each other. Also, a drain of the p-channel transistor is connected to a power supply voltage VDD and a drain of the n-channel transistor is connected to a ground voltage VSS.

Hereinafter, a description will be given of an example of a cell array of a nonvolatile memory device including a unit cell in accordance with the above-described embodiments 1 to 3.

Figure 10:
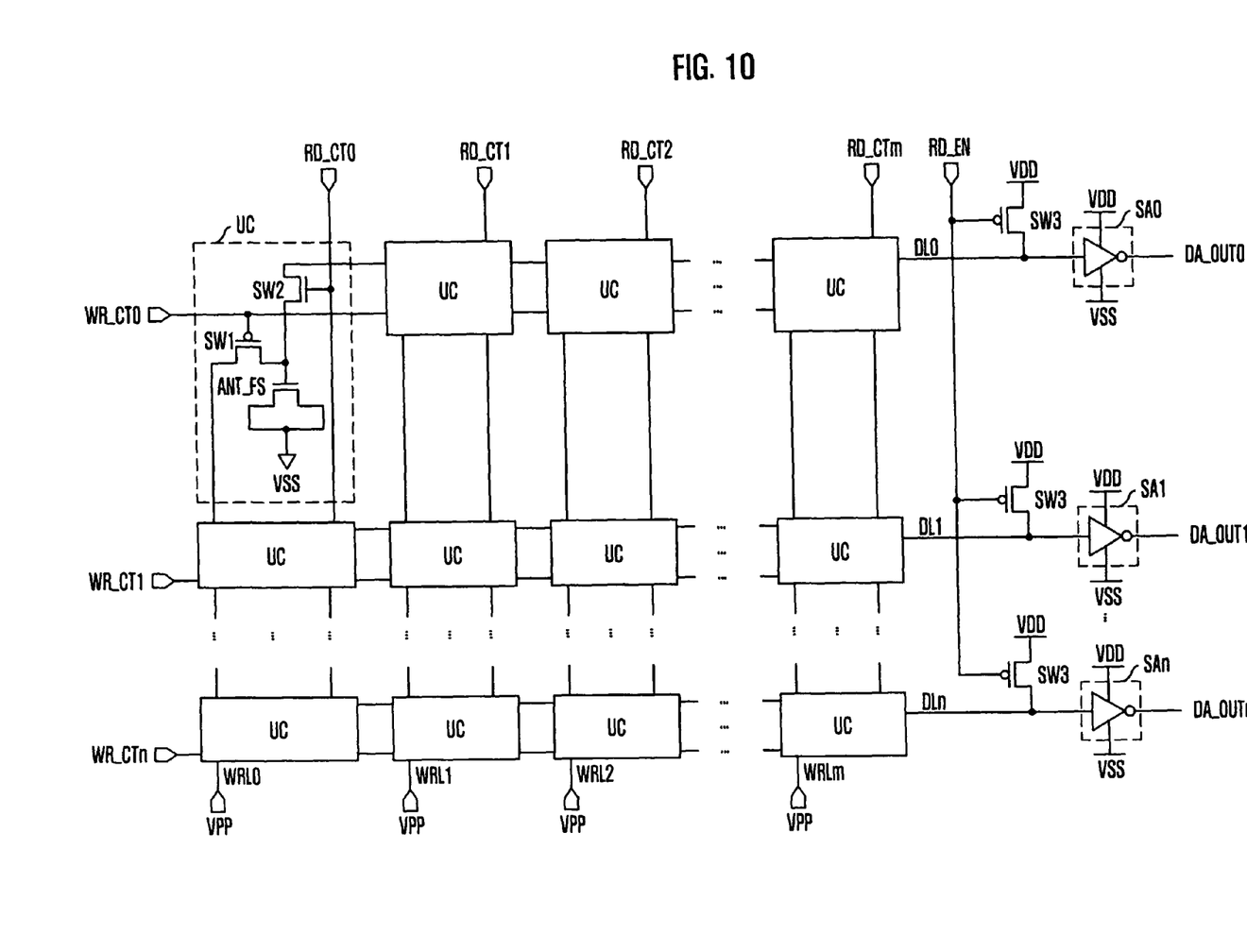
FIG. 10 is an equivalent circuit diagram illustrating an example of a nonvolatile memory device in accordance with an embodiment 4.

FIG. 10 is an equivalent circuit diagram illustrating an example of a nonvolatile memory device in accordance with an embodiment 4.

Embodiment 4

Referring to FIG. 10, an example of a memory cell array of a nonvolatile memory device in accordance with an embodiment 4 includes a plurality of unit cells UC that are arranged in a matrix type. Herein, like the unit cell of the embodiment 1, the unit cell UC includes a switching unit SW1, a second switching unit SW2, and an anti-fuse ANT_FS connected in series to the first and second switching units SW1 and SW2. For example, in the unit cell UC, the first switching unit SW1 includes a p-channel transistor and the second switching unit SW2 includes an n-channel transistor.

Also, an example of the memory cell array of the nonvolatile memory device in accordance with the embodiment 4 includes: a plurality of write driving lines WR_CT0 to WR_CTn (n: a natural number) for selecting the first switching unit SW1 of the unit cell UC; and a plurality of read driving lines RD_CT0 to RD_CTm (m: a natural number) for selecting the second switching unit SW2 of the unit cell UC.

The write driving lines WR_CT0 to WR_CTn extend in a row direction to be connected to the first switching unit SW1 of each of the unit cells UC arranged in the row direction, that is, a gate of a p-channel transistor. The read driving lines RD_CT0 to RD_CTm extend perpendicularly to the write driving lines WR_CT0 to WR_CTn in a column direction to be connected to the second switching unit SW2 of each of the unit cells UC arranged in the column direction, that is, a gate of an n-channel transistor.

Also, an example of the memory cell array of the nonvolatile memory device in accordance with the embodiment 4 includes data lines DL0 to DLn (n: a natural number) and write voltage supply lines WRL0 to WRLm (m: a natural number). Herein, the data lines DL0 to DLn transfer a read voltage to the respective unit cells UC in a read operation, and transfer data outputted from the respective unit cells UC to the sensor units SA0 to SAn (n: a natural number) in the read operation. The write voltage supply lines WRL0 to WRLm transfer a write voltage to the respective unit cells UC in a write operation.

The data lines DL0 to DLn extend in the row direction to connect an input terminal of each of the sensor units SA0 to SAn and an output terminal of each of the unit cells UC arranged in the row direction. The data line connects the second switching unit SW2 (for example, a drain of an n-channel transistor) and an input terminal of the sensor units SA0 to SAn.

In a read operation, the data lines DL0 to DLn transfer a read voltage transferred through a third switching unit SW3, that is, a power supply voltage VDD to the second switching unit SW2, and transfer data outputted from the second switching unit SW2 to the corresponding sensor units SA0 to SAn.

In a read operation, the data lines DL0 to DLn transfer a read voltage transferred through a third switching unit SW3, that is, a power supply voltage VDD to the second switching unit SW2, and transfer data outputted from the second switching unit SW2 to the corresponding sensor units SA0 to SAn The write voltage supply lines WRL0 to WRLm extend in the column direction to be connected to the first switching unit SW1 of each of the unit cells arranged in the column direction, that is, a drain of a p-channel transistor. In a write operation, the write voltage supply lines WRL0 to WRLm transfer a write voltage, that is, a high voltage VPP to the first switching unit SW1 of each of the unit cells UC arranged in the column direction.

Also, an example of the memory cell array, the nonvolatile memory device in accordance with the embodiment 4 includes a plurality of the sensor units SA0 to SAn that are provided respectively to the corresponding data lines DL0 to DLn to sense data outputted through the corresponding data lines DL0 to DLn. The sensor units SA0 to SAn may include an inverter or a differential amplifier (see FIG. 11). For example, the sensor units SA0 to SAn may include an inverter that is simple in circuit structure and thus is advantageous in occupation area and power consumption.

Also, an example of the memory cell array the nonvolatile memory device in accordance with the embodiment 4 includes the third switching unit SW3 that transfers a read voltage, that is, the power supply voltage VDD to the corresponding data lines DL0 to DLn in response to a read operation signal RD_EN in a read operation. Herein, the third switching unit SW3 may include an n-channel transistor or a p-channel transistor. For example, the third switching unit SW3 include a p-channel transistor that is superior in driving capability to an n-channel transistor.

Hereinafter, a description will be given of an example of a write/read operation of the nonvolatile memory device in accordance with the embodiment 4. Herein, for example, a description will be given of a write/read operation of the unit cell UC connected to both the write driving line WR_CT0 and the read driving line RD_CT0.

TABLE 4

| | | | | | Line (Signal) | | | | | |
|---|---|---|---|---|---|---|---|---|---|---|
| Mode | WR_CT0 | WR_CT1 WR_CTn | RD_CT0 | RD_CT1-RD_CTm | DL0 | DL1-DLn | RD_EN | DA-OUT0 | DA-OUT1-DA-OUTn | WRL0-WRLm |
| Write Operation | L | H | L | L | — | — | H | L | — | VPP |
| Read Operation | H | H | H | L | — | — | L | H | — | VPP |

A description will be made with reference to Table 4.

Write Operation

First, one end of the anti-fuse ANT_FS is grounded. Then, a write voltage, that is, a high voltage VPP is applied to the write voltage supply lines WRL0 to WRLm. Also, a logic low level L is applied to the write driving line WR_CT0 and a logic high level H is applied to the other write driving lines WR_CT1 to WR_CTn. Also, a logic level L is applied to the read driving lines RD_CT0 to RD_CTm.

Also, a read operation signal RD_EN is applied in a logic high state. Under this condition, only the first switching unit SW1 is turned on, so that the write voltage supply line WRL0 and the anti-fuse ANT_FS are electrically connected to each other. Accordingly, the high voltage VPP applied through the write voltage supply line WRL0 is transferred through the first switching unit SW1 to the anti-fuse ANT_FS. Thus, a gate insulating layer formed between a substrate and a gate of the anti-fuse ANT_FS is broken by a high electric field.

Read Operation

After completion of the write operation, a logic high level H is applied to the write driving line WR_CT0. Also, a logic high level H is applied to the read driving line RD_CT0 and a logic low level L is applied to the other read driving lines RD_CT1 to RD_CTm. Also, the read operation signal RD_EN is applied in a logic low state.

Under this condition, the second and third switching units SW2 and SW3 are turned on, so that a read voltage, that is, a power supply voltage VDD is transferred through the third switching unit SW3 to the corresponding data line DL0. Accordingly, a current path is formed from the data line DL0, through the second switching unit SW2, to the anti-fuse ANT_FS.

In this case, because a gate insulating layer of the anti-fuse ANT_FS is broken, the data line DL0 is electrically connected to a ground voltage terminal through the second switching unit SW2 and the anti-fuse ANT_FS. Thus, the sensor unit SA0 senses data corresponding to the ground voltage from the data line DL0.

Embodiment 5

Figure 11:
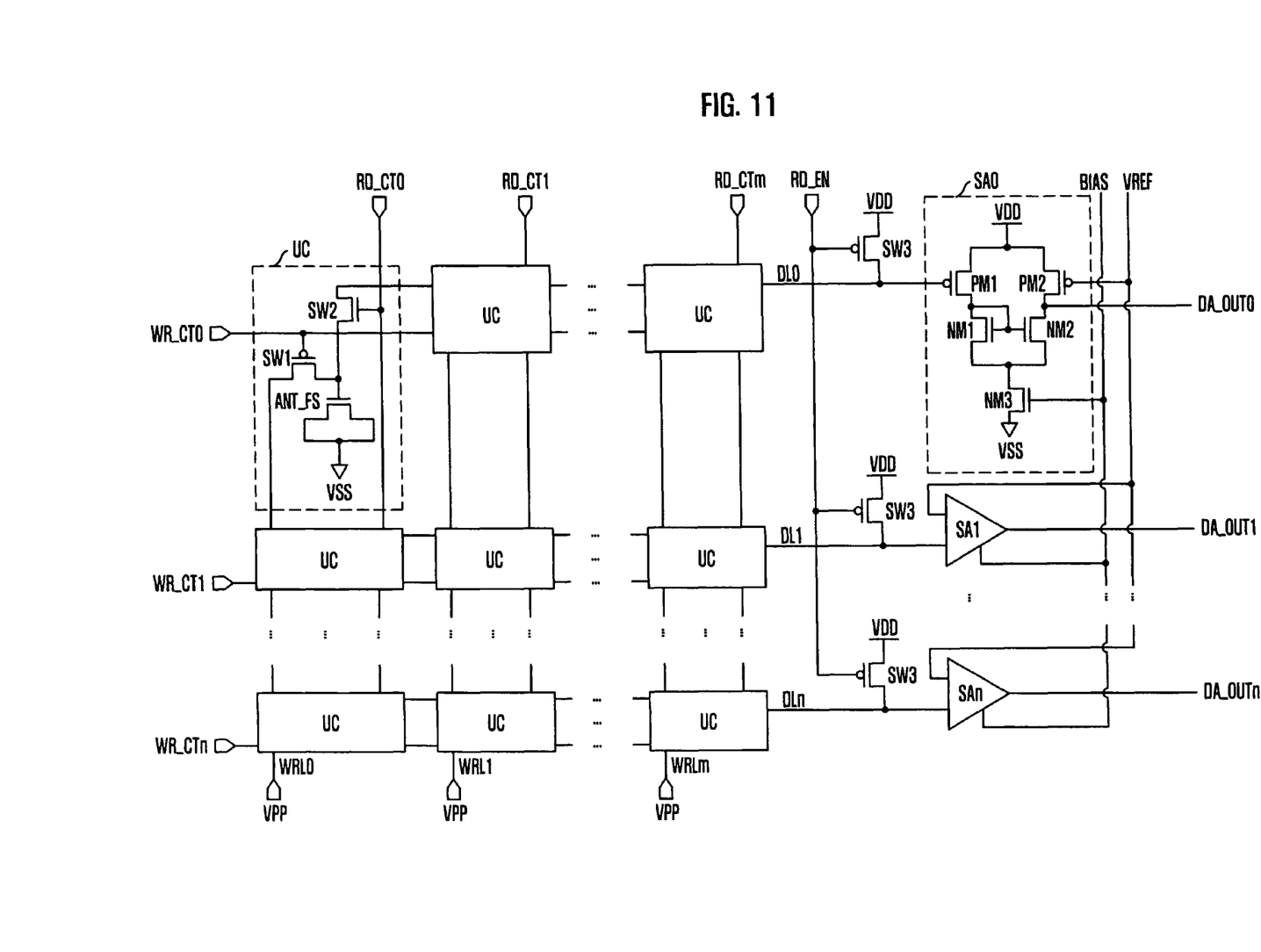
FIG. 11 is an equivalent circuit diagram illustrating an example of a nonvolatile memory device in accordance with an embodiment 5.

FIG. 11 is an equivalent circuit diagram illustrating an example of a nonvolatile memory device in accordance with an embodiment 5.

Referring to FIG. 11, an example of a memory cell array of a nonvolatile memory device in accordance with an embodiment 5 has the same structure as that of the embodiment 4, with the exception that sensor units SA0 to SAn include a differential amplifier instead of an inverter. Herein, the differential amplifier includes p-channel transistors PM1 and PM2 and n-channel transistors NM1, NM2 and NM3. The differential amplifier is operated by a bias signal BIAS to compare a reference voltage VREF and data of the corresponding unit cell outputted from the corresponding data line and amplify the same prior to output.

The other components, except the sensor units SA0 to SAn, are identical to those of the embodiment 4, and thus their detailed description will be omitted for conciseness.

Embodiment 6

Figure 12:
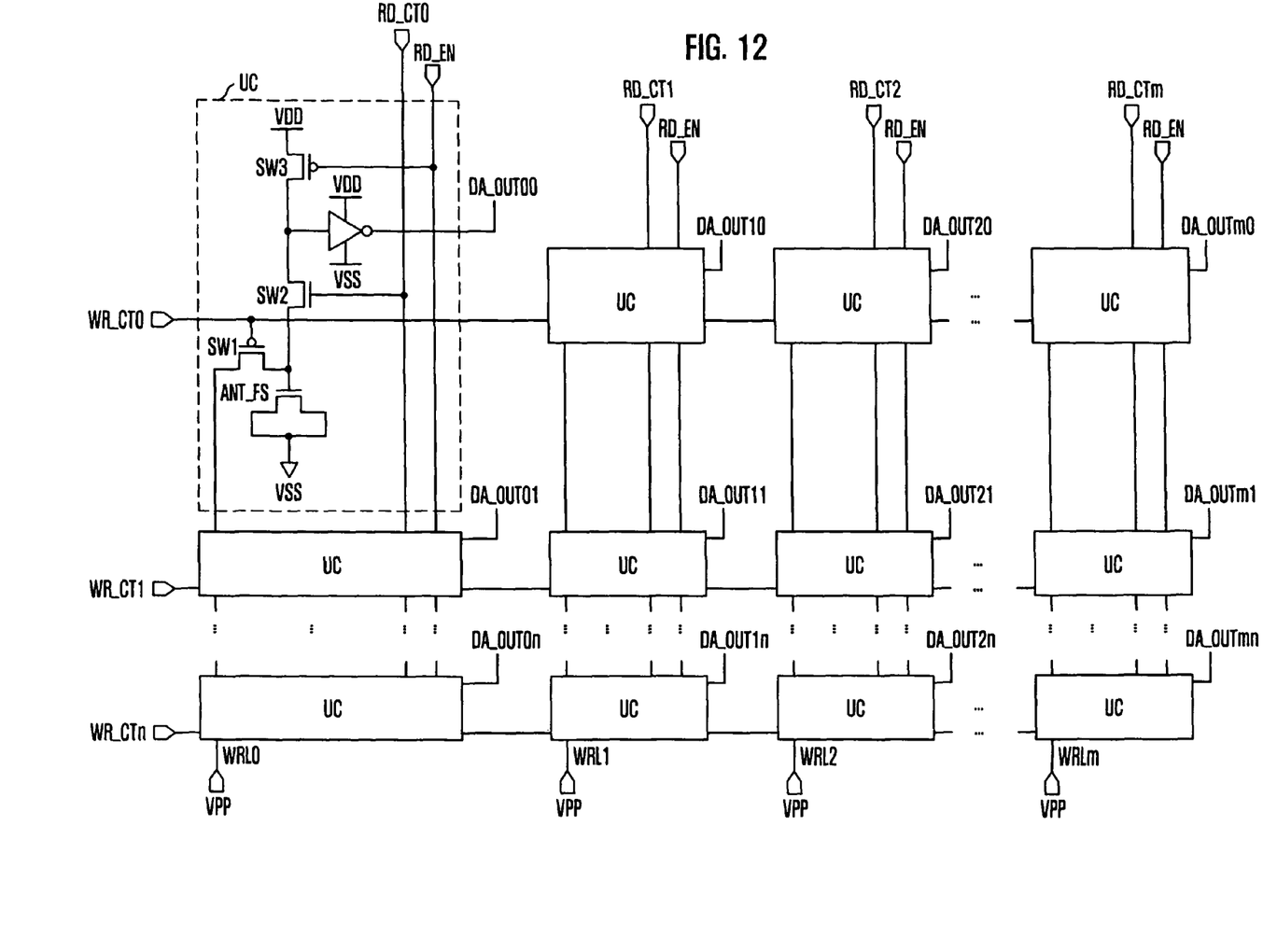
FIG. 12 is an equivalent circuit diagram illustrating an example of a nonvolatile memory device in accordance with an embodiment 6.

FIG. 12 is an equivalent circuit diagram illustrating an example of a nonvolatile memory device in accordance with an embodiment 6.

Referring to FIG. 12, an example of a memory cell array of a nonvolatile memory device in accordance with an embodiment 6 includes a unit cell UC including a third switching unit SW3, unlike the embodiment 4. That is, while the third switching unit SW3 of the embodiment 4 is connected to an end of the corresponding data line DL0 to DLn, that is, an input terminal of the sensor unit SA0 to SAn, the third switching unit SW3 of the embodiment 6 is included in the unit cell UC.

The other components, except the unit cell UC, are identical to those of the embodiment 4, and thus their detailed description will be omitted for conciseness.

Embodiment 7

Figure 13:
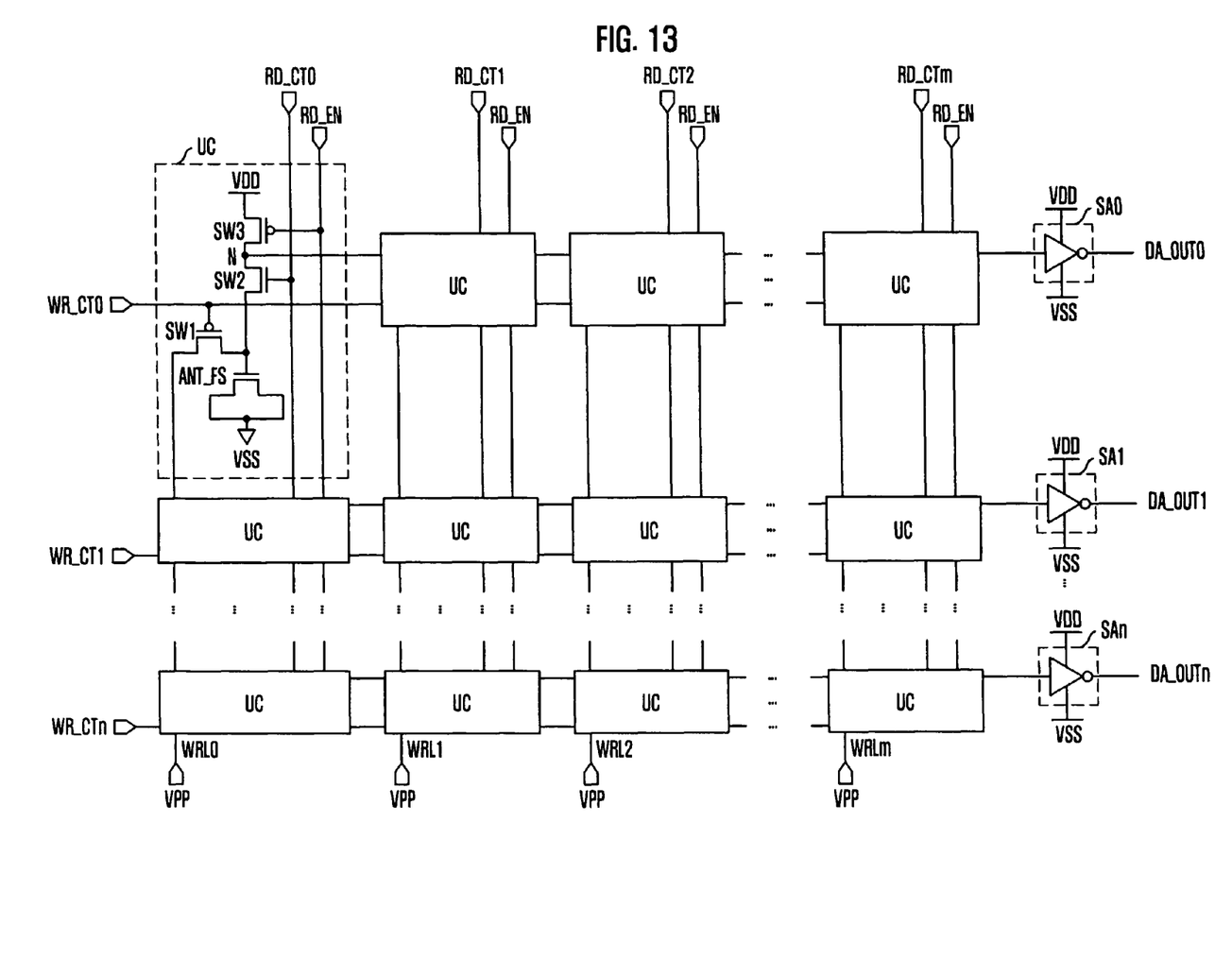
FIG. 13 is an equivalent circuit diagram illustrating an example of a nonvolatile memory device in accordance with an embodiment 7.

FIG. 13 is an equivalent circuit diagram illustrating an example of a nonvolatile memory device in accordance with an embodiment 7.

Referring to FIG. 13, an example of a memory cell array of a nonvolatile memory device in accordance with an embodiment 7 includes a unit cell UC including not only a third switching unit SW3 but also sensor units SA0 to SAn, unlike the embodiment 6. That is, while the sensor unit SA0 to SAn of the embodiment 6 is disposed at an end of the corresponding data line DL0 to DLn, the sensor unit SA0 to SAn of the embodiment 7 is included in the unit cell UC.

Accordingly, unlike the embodiment 6, the embodiment 7 does not need a plurality of data lines DL0 to DLn that connect output terminals of a plurality of unit cells UC, which are arranged in a row direction, in common to the sensor unit SA0 to SAn. Thus, the embodiment 7 may minimize a data loss, that is, a data loss by a resistance value of the data line, which may be generated in the memory cell array structure in accordance with the embodiment 6 and the embodiment 5 including the data line, thereby making it possible to improve the data sensing margin.

The other components, except the unit cell UC, are identical to those of the embodiment 4, and thus their detailed description will be omitted for conciseness.

Embodiment 8

Figure 14:
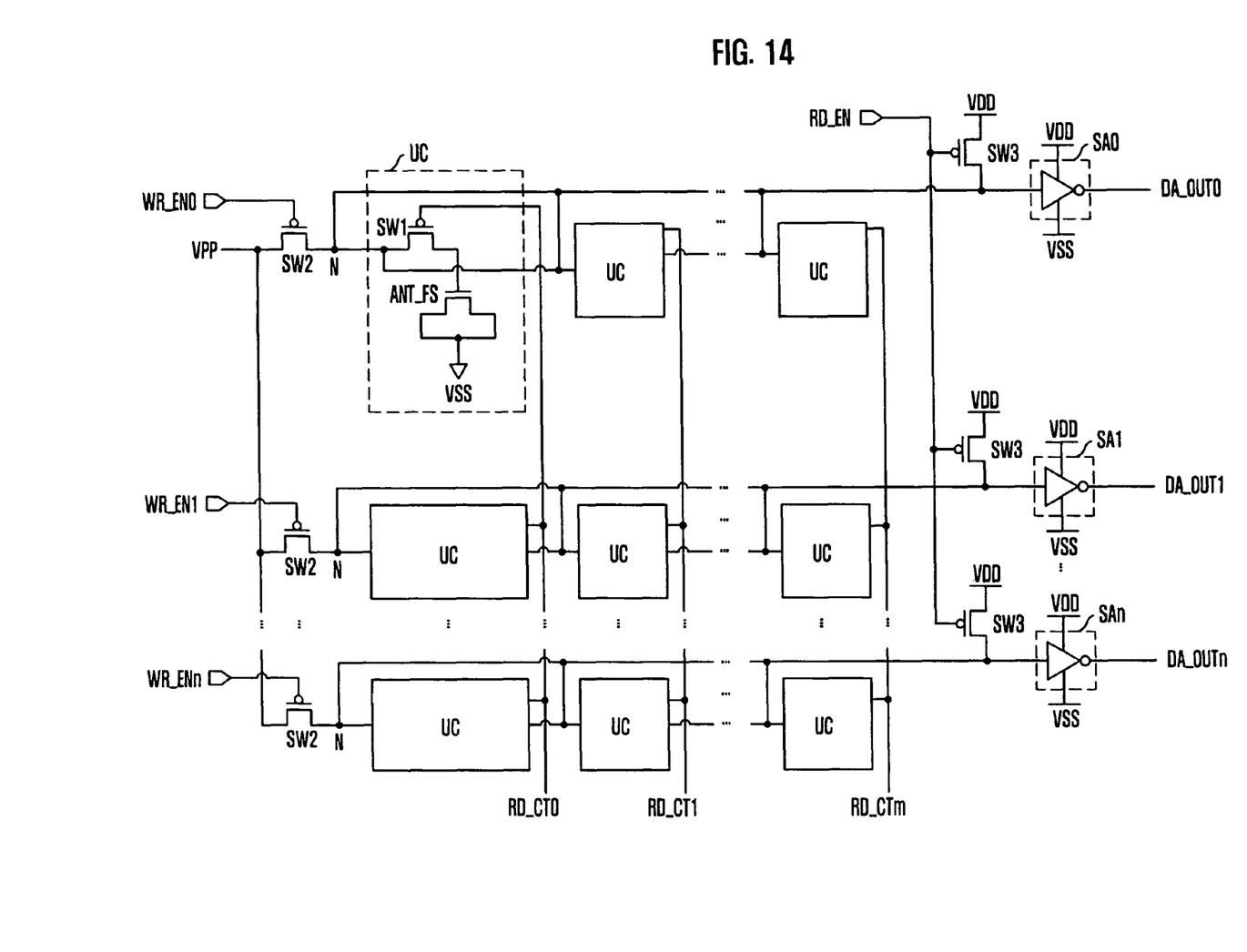
FIG. 14 is an equivalent circuit diagram illustrating an example of a nonvolatile memory device in accordance with an embodiment 8.

FIG. 14 is an equivalent circuit diagram illustrating an example of a nonvolatile memory device in accordance with an embodiment 8.

Referring to FIG. 14, an example of a memory cell array of a nonvolatile memory device in accordance with an embodiment 8 includes a plurality of unit cells UC each including a first switching unit SW1 and an anti-fuse ANT_FS. For example, in the unit cell UC, the first switching unit SW1 includes a p-channel transistor and the anti-fuse ANT_FS includes an n-channel transistor.

Also, an example of the memory cell array of the nonvolatile memory device in accordance with the embodiment 8 invention includes a plurality of second switching units SW2 that are disposed respectively to corresponding rows to transfer a write voltage, that is, a high voltage VPP to the first switching unit SW1. Herein, the second switching unit SW2 may include an n-channel transistor or a p-channel transistor, and transfers the high voltage VPP to the first switching unit SW1 in response to a write operation signal WR_EN0 to WR_ENn.

sponding data lines DL0 to DLn in response to a read operation signal RD_EN. Herein, the third switching unit SW3 may include an n-channel transistor or a p-channel transistor. For example, the third switching unit SW3 may include a p-channel transistor that is superior in driving capability to an n-channel transistor.

Hereinafter, a description will be given of an example of a write/read operation of the nonvolatile memory device in accordance with the embodiment 8. Herein, for example, a description will be given of a write/read operation of the unit cell UC selected by the read driving line RD_CT0 and the write operation signal WR_EN0.

TABLE 5

| | Line (Signal) | | | | | | | | |
|---|---|---|---|---|---|---|---|---|---|
| Mode | WR_EN0 | WR_EN1 WR_ENn | RD_CT0 | RD_CT1-RD_CTm | DL0 | DL1-DLn | RD_EN | DA-OUT0 | DA-OUT1-DA-OUTn |
| Write Operation | L | H | L | H | — | — | H | L | — |
| Read Operation | H | H | L | H | — | — | L | H | — |

Also, an example of the memory cell array of the nonvolatile memory device in accordance with the embodiment 8 includes a plurality of read driving lines RD_CT0 to RD_CTm (m: a natural number) for selecting the first switching unit SW1 of the unit cell UC. The read driving lines RD_CT0 to RD_CTm extend in a column direction to be electrically connected to the first switching unit SW1 of each of the unit cells UC arranged in the column direction, that is, a gate of a p-channel transistor.

Also, an example of the memory cell array of the nonvolatile memory device in accordance with the embodiment 8 includes data lines DL0 to DLn (n: a natural number). In a read operation, the data lines DL0 to DLn transfer a read voltage to an output terminal N of each unit cell UC (i.e., a connection between the first and second switching units), and transfer data outputted from the respective unit cells UC to sensor units SA0 to SAn (n: a natural number) in the read operation.

The data lines DL0 to DLn extend in the row direction to connect an input terminal of each of the sensor units SA0 to SAn and an output terminal of each of the unit cells UC arranged in the row direction. The data line connects the first switching unit SW1 (for example, a drain of a p-channel transistor) and an input terminal of the sensor units SA0 to SAn. In a read operation, the data lines DL0 to DLn transfer a read voltage transferred through a third switching unit SW3, that is, a power supply voltage VDD to the first switching unit SW1, and transfer data outputted from the first switching unit SW1 to the corresponding sensor units SA0 to SAn.

Also, an example of the memory cell array the nonvolatile memory device in accordance with the embodiment 8 includes a plurality of the sensor units SA0 to SAn that are provided respectively to the corresponding data lines DL0 to DLn to sense data outputted through the corresponding data lines DL0 to DLn. The sensor units SA0 to SAn include an inverter that has an input terminal connected to an end of the data lines DL0 to DLn.

Also, an example of the memory cell array the nonvolatile memory device in accordance with the embodiment 8 includes the third switching unit SW3 that transfers a read voltage, that is, the power supply voltage VDD to the corre- A description will be made with reference to Table 5.

Write Operation

First, one end of the anti-fuse ANT_FS is grounded. Then, the write operation signal WR_EN0 is applied in a logic low state and the other write operation signals WR_EN1 to WR_ENn are applied in a logic high state. Also, a logic low level L is applied to the read driving line RD_CT0 and a logic high level H is applied to the other read driving lines RD_CT1 to RD_CTm. Also, the read operation signal RD_EN is applied in a logic high state. Accordingly, the write voltage, that is, the high voltage VPP is transferred through the first and second switching units SW1 and SW2 to the anti-fuse ANT_FS. Thus, a gate insulating layer formed between a substrate and a gate of the anti-fuse ANT_FS is broken by a high electric field.

Read Operation

After completion of the write operation, the write operation signal WR_EN0 is applied in a logic high state. Also, a logic low level L is applied to the read driving line RD_CT0 and a logic high level H is applied to the other read driving lines RD_CT1 to RD_CTm. Also, the read operation signal RD_EN is applied in a logic low state.

Under this condition, the first and third switching units SW1 and SW3 are turned on, so that a read voltage, that is, a power supply voltage VDD is transferred through the third switching unit SW3 to the corresponding data line DL0. Accordingly, a current path is formed from the data line DL0, through the first switching unit SW1, to the anti-fuse ANT_FS. In this case, because a gate insulating layer of the anti-fuse ANT_FS is broken, the data line DL0 is electrically connected to a ground voltage terminal through the first switching unit SW1 and the anti-fuse ANT_FS. Thus, the sensor unit SA0 senses data corresponding to the ground voltage from the data line DL0.

The following effects may be achieved by the above-described teachings.

First, according to teachings above, there is provided first and second switching units connected to the anti-fuse, the first and second switching units being connected in parallel to each other to transfer the write voltage and the read voltage to the anti-fuse through different paths. Thus, this may minimize a read voltage loss in the read operation and improve a sensing margin of data sensed by the output terminal of the unit cell, thereby making it possible to improve the operational reliability.

Second, according to teachings above, there is provided a sensor unit sensing data outputted from the unit cell, the sensor unit being implemented using an inverter. Thus, this may simplify the circuit structure, thereby making it possible to reduce the occupation area and the power consumption.

While examples have been described, it will be apparent to those skilled in the art that various changes and modifications may be made without departing from the of the following claims.

What is claimed is:

1. A unit cell of a nonvolatile memory device, the unit cell comprising:
   an anti-fuse connected between a node and a ground voltage terminal;
   a first switching unit connected to the node and configured to transfer a write voltage to the node;
   a second switching unit connected between the node and an output terminal; and
   a third switching unit connected to the output terminal and configured to transfer a read voltage to the output terminal, the output terminal being commonly directly connected to a drain/source terminal of the second switching unit and a source/drain terminal of the third switching unit.

2. The unit cell of claim 1, wherein the first and second switching units comprise transistors.

3. The unit cell of claim 1, wherein the first and second switching units comprise transistors comprising a same channel type or different channel types.

4. The unit cell of claim 1, wherein:
   the first switching unit comprises a p-channel transistor; and
   the second switching unit comprises an n-channel transistor.

5. The unit cell of claim 1, wherein the anti-fuse comprises a transistor.

6. The unit cell of claim 1, wherein the anti-fuse comprises a capacitor.

7. The unit cell of claim 1, wherein the third switching unit comprises a transistor.

8. The unit cell of claim 1, wherein the first to third switching units comprise transistors comprising a same channel type or different channel types.

9. The unit cell of claim 1, wherein the first and third switching units comprise transistors comprising a same channel type.

10. The unit cell of claim 1, wherein the second and third switching units comprise transistors comprising different channel types.

11. The unit cell of claim 1, wherein:
    the first and third switching units comprise p-channel transistors; and
    the second switching unit comprises an n-channel transistor.

12. The unit cell of claim 1, further comprising a sensor unit configured to sense a voltage applied to the output terminal.

13. The unit cell of claim 12, wherein the sensor unit comprises an inverter configured to invert the voltage applied to the output terminal.

14. The unit cell of claim 12, wherein the sensor unit comprises a differential amplifier configured to sense and amplify the voltage applied to the output terminal.

15. A nonvolatile memory device, comprising:
    a cell array comprising one or more unit cells, arranged in a matrix type, each of the unit cells comprising:
      an anti-fuse connected between a node and a ground voltage terminal;
      a first switching unit connected to the node and configured to transfer a write voltage to the node;
      a second switching unit connected between the node and an output terminal; and
      a third switching unit connected to the output terminal and configured to transfer a read voltage to the output terminal, the output terminal being disposed between the second switching unit and the third switching unit;
    one or more data lines, each of the data lines being connected in common, respectively, to the output terminal of each of the unit cells; and
    one or more sensor units, each of the sensor units comprising inverters configured to respectively invert voltages of the data lines.

16. The nonvolatile memory device of claim 15, wherein:
    the output terminal corresponds to a respective unit cell; and
    the third switching unit is connected to one of the data lines that corresponds to the respective unit cell, the third switching unit being further configured to transfer the read voltage to the one of the data lines that corresponds to the respective unit cell.

17. The nonvolatile memory device of claim 15, wherein:
    the anti-fuse is connected to the ground voltage terminal; and
    the first switching unit is connected between the output terminal and the anti-fuse and further configured to transfer the write voltage to the anti-fuse.

18. The nonvolatile memory device of claim 17, wherein the second switching unit is one of a plurality of second switching units, each of the second switching units being configured to transfer the write voltage to the output terminal.

19. The nonvolatile memory device of claim 18, wherein the third switching unit is one of a plurality of third switching units, each of the third switching units being connected respectively to the data lines to transfer the read voltage to the data lines.

20. The nonvolatile memory device of claim 19, wherein the plurality first, second, and third switching units comprise transistors comprising a same channel type or different channel types.

21. The nonvolatile memory device of claim 19, wherein the plurality of the first and the third switching units each comprise a p-channel transistor.

22. A nonvolatile memory device, comprising:
    a cell array comprising a plurality of unit cells, each of the unit cells being the unit cell of claim 1, arranged in a matrix type;
    a plurality of write driving lines configured to select and control the first switching unit of the unit cell;
    a plurality of first read driving lines configured to select and control the second switching unit of the unit cell;
    a plurality of data lines connected to the output terminal of the unit cell;
    a second read driving line configured to select and control the third switching unit of each of the unit cells in common; and
    a plurality of sensor units configured to sense voltages of each of the data lines.

23. The nonvolatile memory device of claim 22, wherein each of the sensor units comprises an inverter configured to invert the voltages of each of the data lines.

24. The nonvolatile memory device of claim 22, wherein each of the sensor units comprises a differential amplifier configured to amplify a difference between a reference voltage and the voltages of each of the data lines.

25. The nonvolatile memory device of claim 22, wherein the first to third switching units comprise transistors comprising a same channel type or different channel types.

26. The nonvolatile memory device of claim 22, wherein the anti-fuse comprises a transistor.

27. The nonvolatile memory device of claim 22, wherein the anti-fuse comprises a capacitor.

28. A unit cell of a nonvolatile memory device, the unit cell comprising:

an anti-fuse connected between a node and a ground voltage terminal;

a first switching unit connected to the node, the first switching unit comprising:
   a drain configured to receive a write voltage; and
   a source configured to transfer the write voltage to the node when a low logic level is applied to a gate of the first switching unit;

a second switching unit connected to the node and configured to transfer a read voltage to the node; and a third switching unit coupled to the second switching unit, the third switching unit having a gate terminal selectively turning on or off the third switching unit.

29. The unit cell of claim 1, wherein the node is disposed between a voltage source and the anti-fuse.

30. The unit cell of claim 1, wherein the first switching unit and the second and third switching units are arranged in parallel with respect to the node.

* * * * *